United States Patent [19]

Ashley et al.

[11] Patent Number: 5,675,192
[45] Date of Patent: Oct. 7, 1997

[54] PRINTED CIRCUIT BOARD WITH HEADER FOR MAGNETICS ALL MOUNTED TO MOTHER BOARD

[75] Inventors: Donald James Ashley, Shelburne, Vt.; Donald Victor Folker, Fort Wayne, Ind.; James Edward Harvey, Brackney, Pa.; Randhir Singh Malik, Colchester, Vt.

[73] Assignee: International Business Machines Corporation, Armonk, N.Y.

[21] Appl. No.: 540,683

[22] Filed: Oct. 11, 1995

[51] Int. Cl.[6] ........................................... H01F 27/06
[52] U.S. Cl. ..................... 307/17; 361/720; 361/748; 361/761; 361/784; 361/791
[58] Field of Search ........................ 307/17; 361/784, 361/791, 720, 748, 761; 336/65; 363/144; 439/329

[56] References Cited

U.S. PATENT DOCUMENTS

| | | |
|---|---|---|
| Re. 31,704 | 10/1984 | Hester . |
| 3,582,714 | 6/1971 | Shmurak et al. . |
| 3,898,537 | 8/1975 | Mayse et al. . |
| 4,039,900 | 8/1977 | Roback et al. . |
| 4,112,481 | 9/1978 | Roge et al. . |
| 4,184,211 | 1/1980 | Hersom et al. . |
| 4,222,089 | 9/1980 | MacAskill, Jr. et al. . |
| 4,249,229 | 2/1981 | Hester . |
| 4,292,665 | 9/1981 | Hersom et al. . |
| 4,639,834 | 1/1987 | Mayer . |
| 4,652,975 | 3/1987 | Scott . |
| 4,661,792 | 4/1987 | Watkins ................................ 336/65 |
| 4,901,182 | 2/1990 | Book . |
| 4,939,623 | 7/1990 | Equi et al. . |
| 4,999,745 | 3/1991 | Shimatani . |
| 5,001,420 | 3/1991 | Germer et al. ............................ 324/142 |
| 5,034,854 | 7/1991 | Matsumura et al. . |
| 5,072,332 | 12/1991 | Abe . |
| 5,140,745 | 8/1992 | McKenzie ................................ 29/852 |
| 5,515,021 | 5/1996 | Rynkiewicz ................................ 336/65 |

FOREIGN PATENT DOCUMENTS

| | | |
|---|---|---|
| 3939054 | 5/1991 | Denmark . |
| 58-33813 | 2/1983 | Japan . |

*Primary Examiner*—William M. Shoop, Jr.
*Assistant Examiner*—Albert W. Paladini
*Attorney, Agent, or Firm*—Arthur J. Samodovitz

[57] ABSTRACT

A power converter comprises a first printed circuit board containing some of the circuitry of the power converter, a header comprising a support structure and a multiplicity of metallic pins passing through the support structure, and an inductor mounted to the support structure and including wires connected to respective pins. Portions of the pins on one side of the support structure are mounted to the first printed circuit board to support the header in fixed offset relation to the first printed circuit board. Portions of the pins on an opposite other side of the support structure are adapted to mount to a second, mother board to support the header in fixed offset relation to the mother board. Some of the pins carry a first DC/DC voltage from the mother board to the first printed circuit board, other of the pins electrically interconnect the inductor to the first printed circuit board as part of the power converter, and still other of the pins carry a second, output DC voltage from the first printed circuit board to the mother board.

22 Claims, 3 Drawing Sheets

5,675,192

PRINTED CIRCUIT BOARD WITH HEADER FOR MAGNETICS ALL MOUNTED TO MOTHER BOARD

BACKGROUND OF THE INVENTION

The invention relates generally to printed circuit board-header assemblies, and deals more particularly with a support structure for mounting and electrically connecting magnetics to a printed circuit board containing associated electronics, and mounting the resultant electronic device to a mother board.

A DC/DC power supply or converter usually comprises resistors, capacitors, transistors and an inductor. An AC/DC power supply or converter usually includes an additional transformer. The inductor and transformer are often called "magnetics" because of the magnetic field induced in the ferrite core. The resistors, capacitors and transistors can be formed as discrete components mounted directly on a printed circuit board or as an integrated circuit which is directly mounted on a printed circuit board. However, the magnetics cannot be integrated and usually are physically much larger then the other components. Consequently, the magnetics cannot be mounted directly on the printed circuit board without consuming much of the surface area of the printed circuit board. Therefore, it is often desirable to mount the magnetics above or below the printed circuit board in a "header". For example, U.S. Pat. No. 5,253,145 discloses a header which contains magnetics. The header includes pins which mechanically and electrically interconnect the header to the printed circuit board by a surface mount.

In some systems, the power supply or converter is formed on a different printed circuit board than a "mother board" which is powered by the power supply. For example, if the power supply or converter is used to power certain computer hardware on a mother board, the power supply or converter which powers this computer hardware may be formed on a different printed circuit board than the mother board. In the past, each of these printed circuit boards was plugged into a respective edge connector and wires between the two edge connectors were used to interconnect the printed circuit board containing the power supply to the mother board. However, this arrangement did not economize on space or cost.

A general object of the present invention is to provide an improved system for mechanically and electrically connecting a header for magnetics to a printed circuit board containing associated electronic circuitry, and mechanically and electrically interconnecting the resultant device to a mother board.

Another general object of the present invention is to provide a system of the foregoing type which provides greater power per volume than the foregoing prior art system which is interconnected by edge connectors.

SUMMARY

The invention resides in an electronic device comprising a first printed circuit board containing some of the circuitry of the electronic device, a header comprising a support structure and a multiplicity of metallic pins passing through the support structure, and an inductor and/or transformer mounted to the support structure and including wires connected to respective pins. Portions of the pins on one side of the support structure are mounted to the first printed circuit board to support the header in fixed offset relation to the first printed circuit board and provide electrical connection between the first printed circuit board and the inductor and/or transformer. Portions of the pins on an opposite other side of the support structure are adapted to mount to a second printed circuit board (for example, a mother board) to support the header in fixed offset relation to the second printed circuit board and provide electrical connection between the first printed circuit board and the second printed circuit board.

According to one feature of the invention, the electronic device is a DC/DC power converter and it is the inductor which is mounted to the support structure. Some of the pins carry a first DC/DC voltage from the second printed circuit board to the first printed circuit board, other of the pins interconnect the inductor to the first printed circuit board as part of the DC/DC converter, and still other of the pins carry a second, output DC voltage from the first printed circuit board to the second printed circuit board.

BRIEF DESCRIPTION OF THE FIGURES

In FIG. 3, the header and mother board are shown exploded above the printed circuit board to better show the demarcation between the header and the printed circuit board.

DETAILED DESCRIPTION OF THE PREFERRED EMBODIMENT

Figure 1:
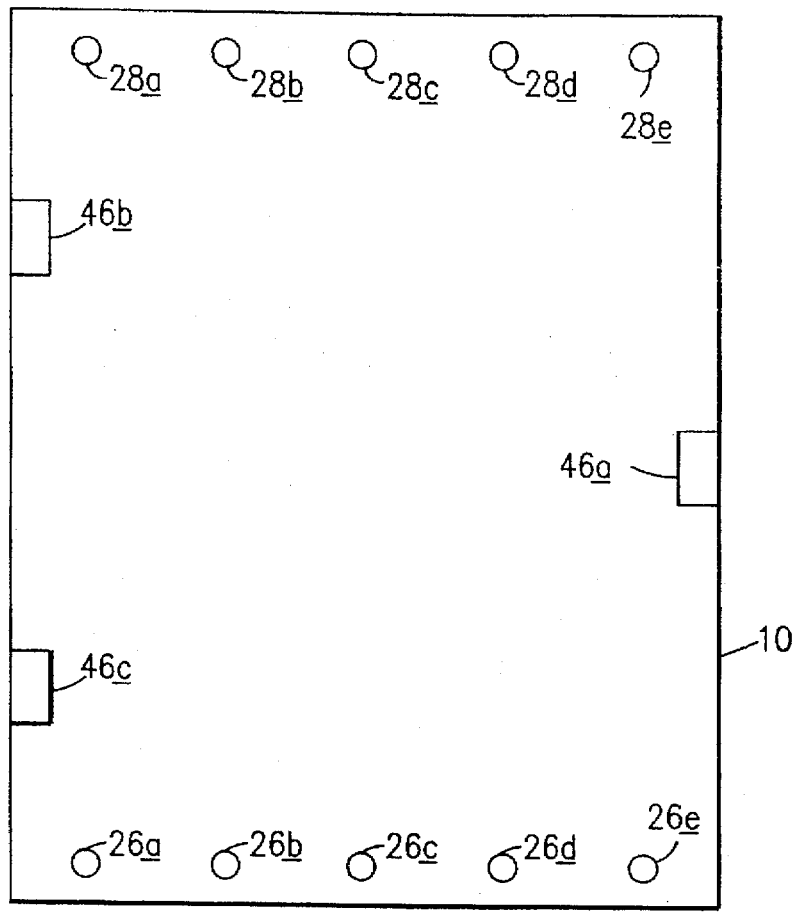
FIG. 1 is a top view of a header for a power supply or converter according to the present invention.
Figure 2:
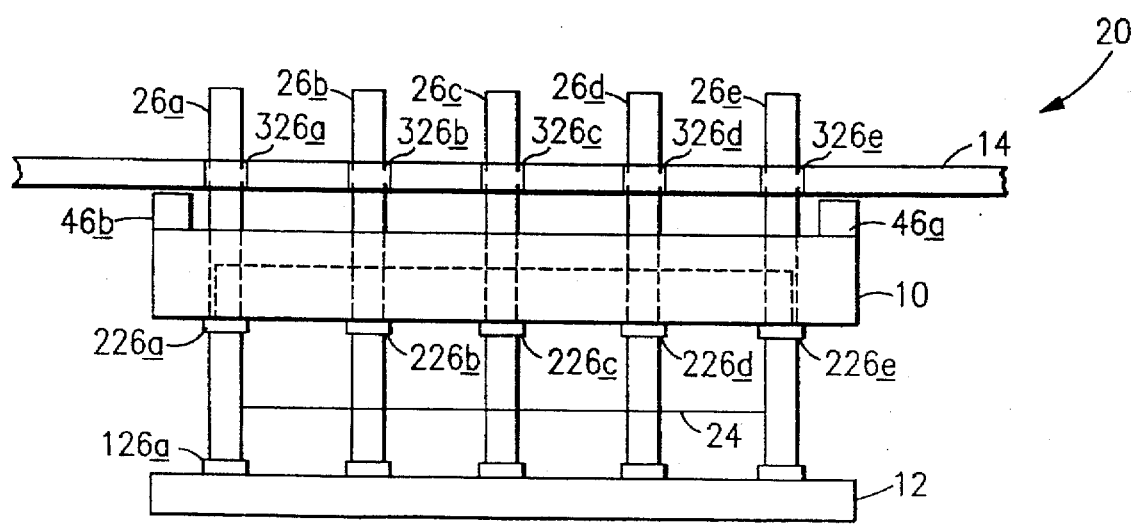
FIG. 2 is one side view of the header of FIG. 1, a printed circuit board containing other circuitry of the power supply or converter and a mother board which is supplied by the power supply or converter and supports the power supply or converter.
Figure 3:
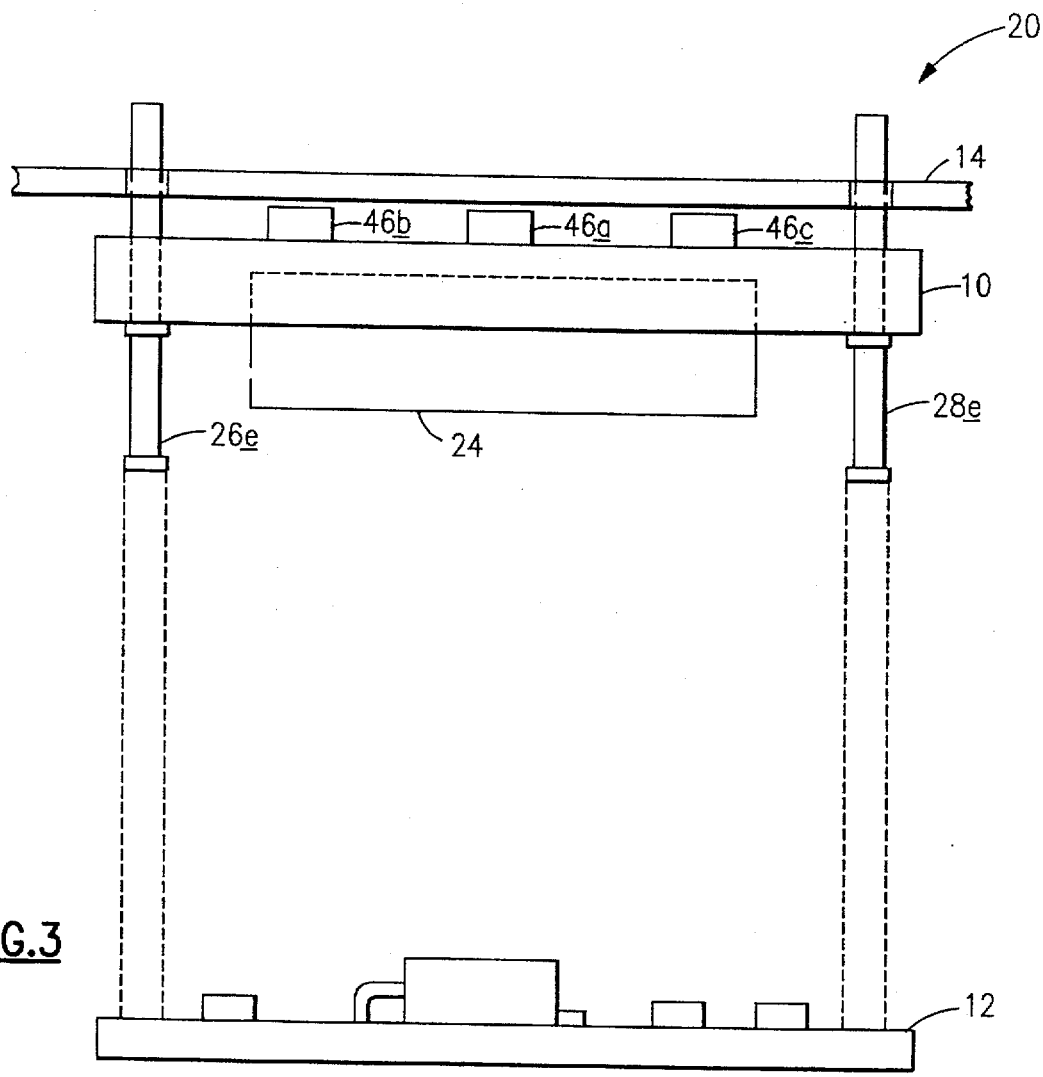
FIG. 3 is another side view (ninety degrees shifted from the side view of FIG. 2) of the header of FIG. 1, the printed circuit board containing other circuitry of the power supply or converter and the mother board which is supplied by the power supply or converter and supports the power supply or converter.

Referring now to the figures in detail, wherein like reference numbers indicate like elements throughout, FIGS. 1–4 illustrate top, one side, another side and bottom views, respectively, of a header 10 for power supply magnetics, a printed circuit board 12 containing other power supply circuitry and an integrated heat sink as described in U.S. Pat. Nos. 5,283,315, 5,305,186, 5,220,487, and 5,263,245, a mother board 14 and/or a power supply/mother board assembly generally designated 20. Header 10 comprises a plate-like support structure having a well 22 which faces the printed circuit board 12 and supports and partially contains a magnetic 24. Alternately, the header could comprise a box-like support structure. In the illustrated example, magnetic 24 is an inductor; however alternately, magnetic 24 could be a transformer. By way of example, the header plate is made from molded plastic resin formed into a solid plate and the well is milled therein.

Figure 5:
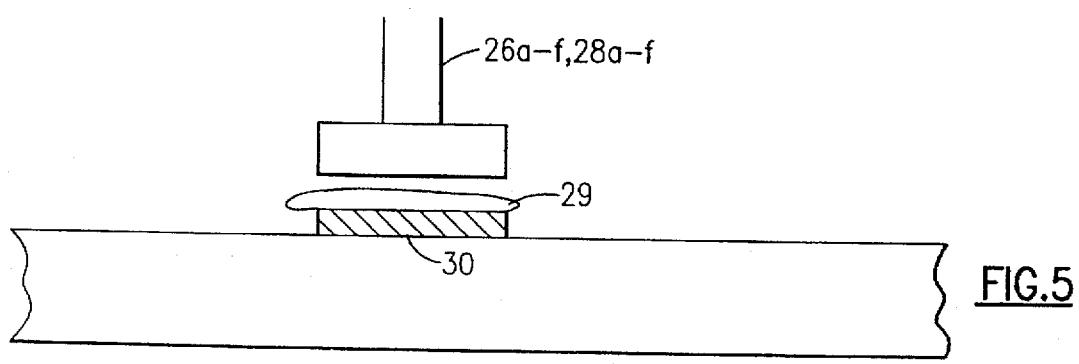
FIG. 5 is an enlarged side view of a surface mount relationship between each of the pins of the header of FIG. 1 and the printed circuit board which contains other circuitry of the power supply or converter.
Figure 4:
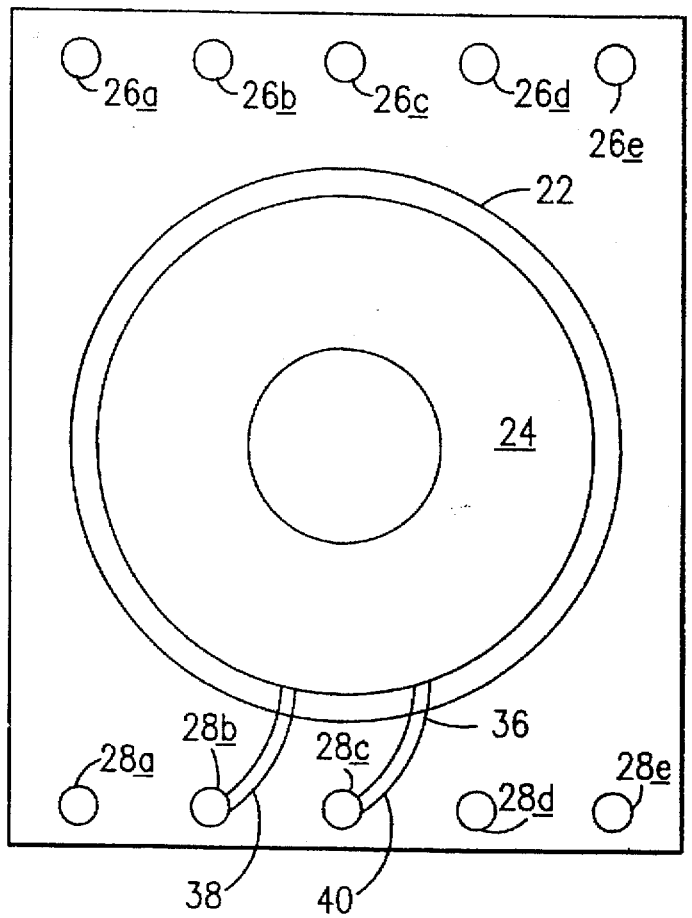
FIG. 4 is a bottom view of the header of FIG. 1 including a magnetic supported therein.

Header 10 also includes two rows of pins 26a–e and 28a–e which pass through holes in the header plate and are secured in the holes by interference fit. This yields a mechanical connection between the header plate and the printed circuit board 12. Each end of each pin 26a–e and 28a–e includes a flange 126a–e and 128a–e, respectively, and is surface mounted by solder 29 onto metallic pads 30 (FIG. 5) of the printed circuit board. Each of the pins 26a–e and 28a–e also includes another flange 226a–e and 228a–e to position the header plate at a uniform height over the printed circuit board 12.

In the illustrated embodiment, the inductor comprises a torroidal, ferrite core and a wire 36 wound around the core. Opposite ends 38 and 40 of the wire 36 are secured to pins 28b,c, by example, wire wrap and then solder. The rigidity of the wires 36 holds the inductor within the well 22. However, if desired the inductor could also be secured by epoxy within the well 22. Opposite ends of pins 28b,c electrically connect to circuitry on printed circuit board 12 via respective pads 30. For example, the inductor is required to form an LC low pass filter (not shown) within the power supply, and pins 28b,c interconnect the inductor 24 to a capacitor (not shown) on the printed circuit board to form the low pass filter.

Pins 26a–e and 28a–e pass through the header plate and extend upwardly from the top of the header plate. (The use of the term "upward" is based on the particular orientation shown in the Figures although the power supply/mother board assembly 20 could be oriented in any direction.) In the illustrated embodiment, pins 26a–e and 28a–e are inserted into through-hole vias in the mother board 14 as far as allowed by ridges 46a–c. The ridges provide a small gap, for example 0.04", between the header plate and the mother board to permit chemical washing of the mother board after fabrication and to clear components, if any, protruding from the underside of motherboard 14. The through-hole vias in mother board 14 which receive pins 26a–e and 28a–e are lined with copper plate. Pins 26a–e and 28a–e are soldered into these holes. Thus, the power supply is mechanically connected to the mother board 14. Pins 26a–d also provide electrical connection between printed circuit board 12 and circuitry of the mother board 14 which is electrically connected to the foregoing through-hole vias. By way of example, the power supply is a DC/DC converter used to convert a five volt DC line available on the motherboard to a three volt DC source for the motherboard. Pins 26 c,d pass the five volts and ground, respectively, from the mother board to the printed circuit board 12, pins 26a,b pass the resultant three volt output and ground, respectively, from printed circuit board 12 to the mother board and pin 28c passes a voltage output feedback signal from mother board 14 to printed circuit board 12. The other pins 26e and 28a,d–e are available to pass other signals between mother board 14 and printed circuit board 12. (If the header contained a transformer instead of or in addition to inductor 24, then these other pins would be used to interconnect other wires of the transformer to printed circuit board 12.)

Figure 6:
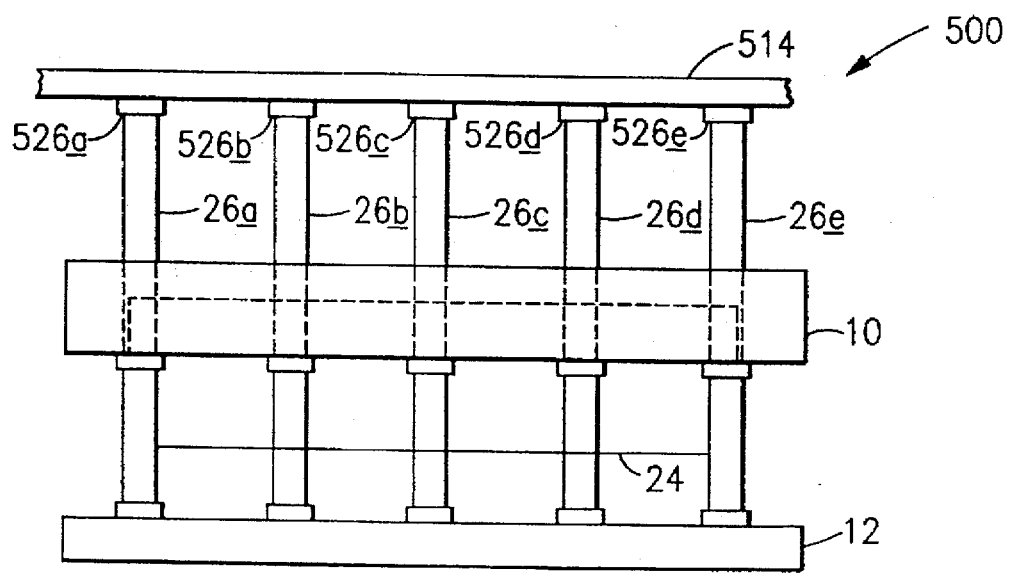
FIG. 6 is a side view of another power supply/motherboard assembly according to another embodiment of the present invention.

FIG. 6 illustrates another embodiment of a power supply/motherboard assembly generally designated 500 according to the present invention. Assembly is identical to assembly 20 except for the following. In assembly 500, each of pins 26a–e and 28a–e includes a flange or broad surface at the top to surface mount to a motherboard 514. (Only flanges 526a–e are shown in FIG. 6 due to the orientation of the figure. However, the flanges at the tops of pins 28a–e are identical to flanges 526a–e.) Motherboard 514 is identical to motherboard 14 except motherboard 514 includes pads such as pads 30 instead of the plated through-holes 326a–e and 328a–e to receive the respective surface mount pins 526a–e and 528a–e. The height of pines 26a–e and 28a–e above header plate 10 is just enough to clear any circuitry on the underside of motherboard 514 above the header plate and to permit the chemical wash. Also, in assembly 514, the header plate 10 does not include ridges 46a–c; they are not needed in view of the surface mount and resultant spacing between header plate 10 and motherboard 514.

Based on the foregoing, a power supply/motherboard assembly according to the present invention has been disclosed. However, numerous modifications and substitutions can be made without deviating from the scope of the present invention. For example, fewer or more pins can be included as required. It is also possible to secure the pins 26a–e and 28a–e to the header plate without the flanges 226a–e and 228a–e. It is also possible, to provide well 22 in the topside of the header plate and connect the wire ends 38 and 40 to the pins 28a,b as they emerge from the top of the header plate. It is also possible to provide pins 26a–e and 28a–e without flanges 126a–e and 128a–e at the bottom, and insert the pins 26a–e and 28a–e into through-hole vias in printed circuit board 12 (instead of surface mount). Also, the same assembly can be used for components requiring magnetics other than power supplies. Therefore, the invention has been disclosed by way of illustration and not limitation, and reference should be made to the following claims to determine the scope of the present invention.

We claim:

1. An electronic device comprising:

a first printed circuit board containing circuitry of the electronic device;

a header comprising a support structure and a multiplicity of metallic pins passing through said support structure, portions of a plurality of said pins on one side of said support structure being mechanically and electrically mounted to said first printed circuit board to support said header in fixed offset relation to said first printed circuit board, and portions of said plurality of pins on an opposite side of said support structure being adapted to mechanically and electrically mount to a second printed circuit board to support said header in fixed offset relation to said second printed circuit board and provide electrical connection between second first printed circuit board and said second printed circuit board, said second printed circuit board being substantially parallel to said first board: and an inductor or transformer mounted to said support structure and including wires connected to respective pins, said respective pins being electrically and mechanically connected to either of said printed circuit boards.

2. An electronic device as set forth in claim 1 wherein said plurality of pins surface mount to said first printed circuit board and space said header and inductor or transformer from said first printed circuit board.

3. An electronic device as set forth in claim 2 wherein said header includes mechanical spacers to space said support structure from said second printed circuit board.

4. An electronic device as set forth in claim 1 wherein said plurality of pins on said one side surface mount to said first printed circuit board and said plurality of pins on said opposite side surface mount to said second printed circuit board.

5. An electronic device as set forth in claim 1 wherein said multiplicity of pins pass through said support structure substantially perpendicular to said support structure.

6. An electronic device as set forth in claim 5 wherein said multiplicity of pins are arranged in two rows along opposite sides of said support structure.

7. An electronic device as set forth in claim 1 wherein said support structure is made of an insulating material.

8. An electronic device as set forth in claim 7 wherein said multiplicity of pins are secured in said support structure by interference fit.

9. An electronic device as set forth in claim 8 wherein said multiplicity of pins include respective flanges which position said support structure at a uniform distance from said first printed circuit board.

10. An electronic device as set forth in claim 1 further comprising said second printed circuit board mechanically connected to said header by said multiplicity of pins on said opposite side of said header, and electrically connected to said first printed circuit board via said plurality of pins.

11. An electronic device as set forth in claim 1 wherein said support structure is substantially parallel to said first and second printed circuit boards.

12. An electronic device as set forth in claim 1 wherein said electronic device is a power supply.

13. An electronic device as set forth in claim 1 wherein said electronic device is a power converter, one of said multiplicity of pins carries a first DC voltage from said second printed circuit board to said first printed circuit board, said respective pins interconnect said inductor or transformer to said first printed circuit board as part of said converter, and other of said multiplicity of pins carry a second, output DC voltage from said first printed circuit board to said second printed circuit board.

14. An electronic device as set forth in claim 1 wherein said support structure is plate-like with a well which partially contains said inductor or transformer.

15. An electronic device as set forth in claim 1 wherein said header comprises another multiplicity of metallic pins passing through said support structure, portions of a plurality of said other multiplicity of pins on said opposite side of said support structure being adapted to mount to said second printed circuit board to support said header and provide electrical connection between said second printed circuit board and said header.

16. An electronic device comprising:

a first printed circuit board containing circuitry of the electronic device;

a header comprising a support structure and a multiplicity of metallic pins passing through said support structure, portions of a plurality of said pins on one side of said support structure being mounted to said first printed circuit board to support said header, and portions of said plurality of pins on an opposite side of said support structure being adapted to mount to a second printed circuit board to support said header and provide electrical connection between said first printed circuit board and said second printed circuit board, said first and second printed circuit boards being substantially parallel to each other; and an inductor or transformer mounted to said support structure and including wires connected to respective pins, said respective pins being electrically and mechanically connected to either of said printed circuit boards.

17. An electronic device as set forth in claim 16 wherein said respective pins are electrically connected only to said first printed circuit board.

18. An electronic device as set forth in claim 16 further comprising said second printed circuit board mechanically connected to said header by said multiplicity of pins on said opposite side of said header, and electrically connected to said first printed circuit board via said plurality of pins.

19. An electronic device as set forth in claim 16 wherein said header comprises another multiplicity of metallic pins passing through said support structure, portions of a plurality of said other multiplicity of pins on said opposite side of said support structure being adapted to mount to said second printed circuit board to support said header and provide electrical connection between said second printed circuit board and said header.

20. An electronic device as set forth in claim 16 wherein said electronic device is a power converter, one of said plurality of pins carry a first DC voltage from said second printed circuit board to said first printed circuit board, said respective pins interconnect said inductor or transformer to said first printed circuit board as part of said power converter, and another of said plurality of pins carries a second, output DC voltage from said first printed circuit board to said second printed circuit board.

21. An electronic device as set forth in claim 17 wherein said respective pins are mechanically connected to both said first and second printed circuit boards.

22. An electronic device as set forth in claim 19 wherein portions of said plurality of said other multiplicity of pins on said one side of said support structure being adapted to mount to said first printed circuit board to support said header.

* * * * *

UNITED STATES PATENT AND TRADEMARK OFFICE
CERTIFICATE OF CORRECTION

PATENT NO. : 5,675,192
DATED : 10/7/97
INVENTOR(S) : D. J. Ashley et al

It is certified that error appears in the above-indentified patent and that said Letters Patent is hereby corrected as shown below:

Column 4, line 42, delete "second" and insert --said--.

Signed and Sealed this

Ninth Day of February, 1999

Attest:

Attesting Officer

*Acting Commissioner of Patents and Trademarks*